(12) United States Patent
Garcia-Blanco et al.

(10) Patent No.: US 8,395,229 B2
(45) Date of Patent: Mar. 12, 2013

(54) MEMS-BASED GETTER MICRODEVICE

(75) Inventors: Sonia Garcia-Blanco, Enschede (NL);
Fraser Williamson, Enschede (NL);
Jean François Viens, Palo Alto, CA (US)

(73) Assignee: Institut National D'Optique, Sainte-Foy, Quebec (CA)

( * ) Notice: Subject to any disclaimer, the term of this patent is extended or adjusted under 35 U.S.C. 154(b) by 210 days.

(21) Appl. No.: 13/046,403

(22) Filed: Mar. 11, 2011

(65) Prior Publication Data
US 2012/0228733 A1    Sep. 13, 2012

(51) Int. Cl.
*H01L 31/058*    (2006.01)
*H01L 23/20*    (2006.01)
(52) U.S. Cl. ............... 257/467; 257/682; 257/E23.137
(58) Field of Classification Search .................. 257/467, 257/682, E23.137
See application file for complete search history.

(56) References Cited

U.S. PATENT DOCUMENTS

| | | |
|---|---|---|
| 5,656,778 A | 8/1997 | Roszhart |
| 5,701,008 A | 12/1997 | Ray et al. |
| 5,895,233 A | 4/1999 | Higashi et al. |
| 5,934,964 A | 8/1999 | Carella et al. |
| 5,952,572 A | 9/1999 | Yamashita et al. |
| 6,139,390 A | 10/2000 | Pothoven et al. |
| 6,499,354 B1 | 12/2002 | Najafi et al. |
| 6,534,850 B2 | 3/2003 | Liebeskind |
| 6,806,557 B2 | 10/2004 | Ding |
| 6,897,551 B2 | 5/2005 | Amiotti |
| 7,115,436 B2 | 10/2006 | Lutz et al. |
| 7,364,932 B2 * | 4/2008 | Ikushima et al. ............. 438/53 |
| 7,696,622 B2 | 4/2010 | Takemoto et al. |
| 8,040,587 B2 | 10/2011 | Palmateer |
| 2008/0213539 A1 | 9/2008 | Souriau et al. |

FOREIGN PATENT DOCUMENTS

| | | |
|---|---|---|
| EP | 2 362 230 A1 | 8/2001 |
| JP | 2011-131207 A | 7/2011 |

OTHER PUBLICATIONS

International Search Report for corresponding International Patent Application No. PCT/CA2011/000275 mailed Nov. 23, 2011.
Sparks, D. et al. "Chip-Level Vacuum Packaging of Micromachines Using NanoGetters", IEEE Transactions on Advanced Packaging, vol. 26, No. 3, Aug. 2003, pp. 277-282.

(Continued)

*Primary Examiner* — Howard Weiss
(74) *Attorney, Agent, or Firm* — Merchant & Gould P.C.

(57) ABSTRACT

A MEMS (micro-electro-mechanical system) getter microdevice for controlling the ambient pressure inside the hermetic packages that enclose various types of MEMS, photonic, or optoelectronic devices. The getter microdevice revolves around a platform suspended at a height above a substrate, and which is supported by supporting legs having low thermal conductance. Layers are deposited on the platform, such layers including a properly patterned resistor element, a heat-spreading layer and, finally, a thin-film getter material. When an electrical current flows through it, the resistor element heats the thin-film getter material until it reaches its activation temperature. The getter material then absorbs the gas species that could be present in the hermetic package, such gas species possibly impairing the operation of the devices housed in the packages while reducing their lifetime. The weak thermal conductance between the platform and the substrate helps in preventing damages to the surrounding devices when the MEMS getter microdevice is heated at its activation temperature, and it reduces the electrical power required for reaching the activation temperature as well.

9 Claims, 10 Drawing Sheets

OTHER PUBLICATIONS

Howlader, M. et al. "Comparative annealing effect on bonded wafers in air and ultrahigh vacuum for microelectromechanical systems/microfluidics packaging," Journal of Micro/Nanolith, MEMS MOEMS, vol. 9, No. 4, Oct.-Dec. 2010, pp. 000000-1-000000-11.

Garcia-Blanco, S. et al. "3-D MOEMS-based optical micro-bench platform for the miniaturization of sensing devices", Proc. of SPIE, vol. 6887, Feb. 2008 pp. 68870F-1-68870F-9.

Garcia-Blanco, S. "Low-temperature vacuum hermetic wafer-level package for uncooled microbolometer FPAs", Proc. of SPIE, vol. 6884, Feb. 2008, pp. 68840P-1-68840P-8.

Howlader, M. "MEMS/Microfluidics Packaging Without Heating", Proc. of SPIE, vol. 7592, Feb. 2010, pp. 75920H-1-75920H-14.

* cited by examiner

MEMS-BASED GETTER MICRODEVICE

FIELD OF THE INVENTION

This invention relates to microdevices for controlling the ambient pressure inside the hermetic packages that enclose MEMS, photonic, and/or optoelectronic devices. More particularly, this invention relates to a MEMS microdevice integrated in a hermetic enclosure and consisting of an active thin-film getter used for controlling the gas composition and pressure therein.

BACKGROUND OF THE INVENTION

Several types of IC (integrated circuits), MEMS (micro-electro-mechanical systems) and optoelectronic/photonic devices need to be packaged in an inert or vacuum atmosphere to operate correctly. Outgassing, microleaks and diffusion are the most common mechanisms leading to a progressive increase of the pressure within vacuum/hermetic packages. These mechanisms also change the gas composition in the microcavity of hermetic packages. For instance, devices made from III-V semiconductor materials are found to be particularly sensitive to outgassed gas species such as hydrogen, while moisture affects many semiconductor and MEMS devices. Furthermore, changes in the ambient pressure in a microcavity can impair the operation of the devices housed therein. Likewise, the presence of undesired gaseous species can degrade the device performance even if their partial pressures remain very low. With the current trend in reducing the packaging size of IC's, MEMS, and optoelectronic/photonic microdevices, the control of the pressure, gas composition and gas concentration in the microcavities becomes a challenge, with the consequent increase in packaging costs and lower manufacturing yields. Long outgassing runs performed at high temperature are normally required to reduce future outgassing from the various package components once the sealing step has been completed, thus reducing the throughput of the packaging process along with increasing costs.

Examples of devices requiring a vacuum atmosphere maintained throughout their lifetime include, but are not limited to, IR (infrared) detectors (as shown in U.S. Pat. No. 5,895,233 to Higashi et al.), gyroscopes, microaccelerometers (as shown in U.S. Pat. No. 5,656,778 to Roszhart and U.S. Pat. No. 5,952,572 to Yamashita et al.), micromirrors, miniaturized resonators, solar cells, flat panel displays (as shown in U.S. Pat. No. 5,934,964 to Carella et al.), pressure transducer devices, and ring laser gyroscopes. Some other types of devices must be surrounded by an inert atmosphere maintained at a predetermined base pressure. The presence of moisture results in stiction problems in MEMS devices and to failures in semiconductor IC devices.

Gas-absorbing materials, commonly known as getters, are currently used to control the pressure inside sealed microcavities. As vacuum/hermetic packages shrink, the electrically-activated getters, well known in the art, get too bulky to fit in these microcavities. Using getter materials in the form of thin films can solve this problem.

In conventional getter systems, the thin-film getter material is deposited on structures having various shapes and it is heated either by bake out, by an electrical resistor, by RF (radio-frequency) heating or by absorption of laser radiation. Heating allows the getter material to reach its activation temperature, which is typically in the range of 400° C. to 1000° C. Such elevated temperatures permit the diffusion into the bulk of the getter material of the passivation layer that grows on the surface of the getter, thus leaving a fresh surface area ready for further capture of different gas species. The activation temperature depends on the composition of the getter material. For example, alloys of zirconium have an activation temperature lying between 300° C. and 1000° C., while getter films made up of elemental zirconium or of titanium must be heated to 600-700° C. Unfortunately, these high activation temperatures can damage the semiconductor devices and MEMS microstructures integrated in the packages. Furthermore, such high activation temperatures can damage the structural parts of a vacuum/hermetic package such as the hermetic joints, the antireflection coatings, and the die-attached materials. In addition, heating the whole assembly to the activation temperature of the getter can generate a great deal of thermal stress to the assembly. The stress comes from the close contact of components made up of materials having slightly different thermal expansion coefficients. It is also well known that subjecting the whole package to such elevated temperatures can induce outgassing. Solutions proposed in the prior art include placing the getter and the device into two separate compartments formed within the package. Other solutions rely on localized heating methods such as laser heating or electrical Joule heating. These solutions however, impact negatively on the complexity of the packages and on their costs.

INO (Quebec City, Canada), which is the current assignee of the present application, has developed a low-temperature vacuum micropackaging wafer-level or chip-to-wafer process for its $VO_x$ (vanadium mixed oxide) based microbolometer detectors. Further details can be found in S. Garcia-Blanco et al. (2008) "Low-temperature vacuum hermetic wafer-level package for uncooled microbolometer FPAs" (*Proceedings of the SPIE* vol. 6884, paper 68840P). This micropackaging process subjects the microbolometer chip to a temperature that does not exceed 140° C. In principle, this maximum temperature could be reduced further provided that an efficient getter is integrated in the package to reduce the temperature required for the outgassing step prior to vacuum sealing. For IR $VO_x$-based microbolometer detectors, a very good vacuum (typically less than 10 mTorr for most applications) must be maintained over the lifetime of the package, which is typically 5 to 10 years. The lifetime of the package, defined here as the time it takes for the pressure inside of the microcavity to reach a certain maximum permissible value, depends on the amount of gases outgassed in the microcavity as well as on the volume of the microcavity. The micropackaging technology referred to above provides a ceramic spacer having an adjustable thickness in order to provide different cavity volumes.

Biocompatible packages and vacuum packaging of biocompatible devices are other examples wherein the heating of the package at elevated temperature is not an option. These devices rely frequently on functionalized molecules that cannot withstand elevated temperatures.

Another technique for achieving low-temperature vacuum-hermetic packaging is reported in M. R. Howlader (2010) "MEMS/microfluidics packaging without heating" (*Proceedings of the SPIE* vol. 7592, paper 75920H). To achieve a good vacuum, an outgassing run at an elevated temperature should be carried out for a prolonged period together with the integration of a performing getter, which is usually activated at temperatures ranging from 300° C. to 1000° C. Therefore, a device that would allow activation of the getter without undue heating of the neighboring components in the package would be a great advantage.

The getter material must be present in sufficient quantity in the package to ensure that the ambient pressure remains below a predetermined maximum value during the entire lifetime of the packaged device. The maximum permissible pressure depends on the particular application, but its value ranges from less than 10 mTorr to a few hundreds Torrs. The shrinking of the packages calls for the use of more and more compact getters. The cavity volumes of the packages of current MEMS, semiconductor, electronics or photonics devices vary from a few nanoliters to thousands of microliters, therefore limiting seriously the room space available for insertion of conventional getters, as described above.

As shown in the schematic sectional view of FIG. 1 (PRIOR ART), patents of the prior art such as U.S. Pat. No. 6,897,551 to Amiotti disclose the deposition of a non-evaporable getter (NEG) material 13 on an inner surface of the cover 12 of a package that defines a microcavity 14 in which a MEMS microdevice 11 is enclosed. This approach works provided that the cover 12 is not used as an optical window, thus precluding its implementation with MEMS microdevices that must interact with the outside via the capture and/or emission of optical radiation. Alternatively, the gettering material can be deposited in close proximity to the microdevice structure, so that there is no obstruction of any possible optical radiation path (see U.S. Pat. No. 6,534,850 to Liebeskind). Referring now to the cross-sectional side view of FIG. 2A (PRIOR ART), a thin-film non-evaporable getter 180 made up of a material 181 is deposited on the same substrate 140 as the electronic devices (e.g. transistors) 120 and the vacuum device 130, all of these devices requiring to be packaged inside a vacuum microcavity 194. During electrical activation of the thin-film getter 180, temperature sensors trig an alarm signal as soon as the temperature of the substrate 140 approaches a level that could damage the electronic devices 120. In the exemplary configuration shown in FIG. 2A, the thin-film getter 180 thermally connects to the substrate 140 through the dielectric layer 150. The layer 150 provides thermal insulation to protect the electronic devices 120, but this insulation may not be sufficient during activation of the getter 180. When the getter 180 reaches its activation temperature, the temperature rise of the substrate 140 and the heat conduction therein then call for safely spacing the electronic devices 120 from the thin-film getter 180. As a consequence, attempts at reducing further the whole package size are seriously compromised. In addition, the substrate 140 acts as a heat sink that raises the electrical power required to set the thin-film getter 180 at its activation temperature. The flowchart diagram of FIG. 2B (PRIOR ART) illustrates the way the thin-film getter 180 is activated.

Referring now to FIG. 3 (PRIOR ART), there is shown an exemplary configuration disclosed in U.S. Pat. No. 7,696,622 to Takemoto et al. in which continuous thin-film getters 40a, 40b, and 40c are deposited on the bottom surfaces and on the sidewalls of the vacuum microcavities 34. The getters serve to control the pressure inside the microcavities 34. Unfortunately, the getters 40a, 40b, and 40c are in close thermal contact with a lower glass substrate 32, thus raising the electrical power needed for their activation.

As depicted in the cross-sectional side view of FIG. 4 (PRIOR ART), U.S. Pat. No. 7,309,865 to Ikushima et al. teaches an approach for decreasing the electrical power required for proper activation of a getter film. The non-evaporable thin-film getter 185 is attached to the sidewalls 26 of a microcavity by means of microfabrication techniques. The conductance of the thermal path between the getter film 185 and the substrate 160 is therefore lowered, so that less electrical power is required to activate the getter. However, a specific microfabrication process flow is necessary to implement the configuration depicted in FIG. 4, the process flow being not compatible with that of the MEMS devices to be integrated in the microcavity. Furthermore, the surface area of the getter 185 is limited to the horizontal extent of the vacuum microcavity. Complex packaging strategies must be developed to implement the gettering scheme depicted in this figure.

Techniques for increasing the surface area of getters have been disclosed in U.S. Pat. No. 7,115,436 to Lutz et al., U.S. Pat. No. 5,701,008 to Ray et al., and U.S. Pat. No. 6,806,557 to Ding. In many cases, the getter is activated during the sealing of the lid (cover). This step can be performed by silicon direct bonding, anodic bonding, glass frit bonding, soldering, or eutectic bonding. The interested reader can refer for example to U.S. Pat. No. 6,499,354 to Najafi et al. and to D. R. Sparks et al. (2003) "Chip-level vacuum packaging of micromachines using nanogetters", (*IEEE Transactions on Advanced Packaging* vol. 26, pp. 277-282). Unfortunately, the elevated temperatures (typically above 300° C.) required during performance of these bonding techniques can damage the devices (such as MEMS, photonic devices, or electronic devices) being packaged. Safer techniques for activating getters have been developed. These techniques include separate heating of the lid prior to final assembly and sealing, local laser heating (see U.S. Pat. No. 6,139,390 to Pothoven et al.) and getter activation by electrical pulses (see U.S. Pat. No. 6,534,850 to Liebeskind). Those skilled in the art will appreciate the increased complexity of these packaging processes and their subsequent impacts on the manufacturing costs and throughput.

From the above discussion and in view of the various solutions disclosed in the documents of the prior art reviewed above, there is a need for devising selective heating schemes to permit the activation of thin-film getters integrated inside vacuum/hermetic packages. These schemes must be devised in such a way that the heat generated during the process does not flow significantly towards the other components integrated in the microcavity. In addition, it is desired that these schemes be fully compatible with the process flows of current use for manufacturing MEMS devices to be packaged in order to keep the end costs of these products as low as possible.

SUMMARY OF THE INVENTION

The object of the present invention is a MEMS-based getter microdevice that can be fabricated according to a process flow compatible with those used for manufacturing typical MEMS devices and, in particular, $VO_x$-based IR microbolometer array devices. The MEMS-based microdevice of the present invention allows localized heating of a thin-film getter material deposited on its surface without affecting its surroundings. The MEMS-based microdevice of the present invention can then be integrated with CMOS circuitry as well as with other MEMS microdevices. It can be reactivated several times during the lifetime of the package without impairing the performance of the microdevices or of the MEMS structures enclosed in the same microcavity. This is due to the fact that the getter takes the form of a locally-heated suspended structure that provides thermal insulation between the thin-film getter and the substrate. The MEMS getter microdevice can be coupled with pressure-sensing microdevices and temperature sensors, both fabricated using the same process flow and on a common substrate. The output signal from a pressure-sensing microdevice could serve to determine when the reactivation of the MEMS getter microdevice is needed. In turn, the temperature microsensors are to verify that the temperature around the MEMS getter microdevice does not raise beyond a predetermined maximum temperature, therefore preventing degradation of the CMOS circuitry or of the MEMS devices packaged in the microcavity. Note that the integration of temperature sensors with pressure microgauges also helps in obtaining more precise pressure measurements by allowing correction of the pressure readings to compensate for any temperature dependence in the operation of the pressure microgauges.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF PREFERRED EMBODIMENTS OF THE INVENTION

Figure 1:
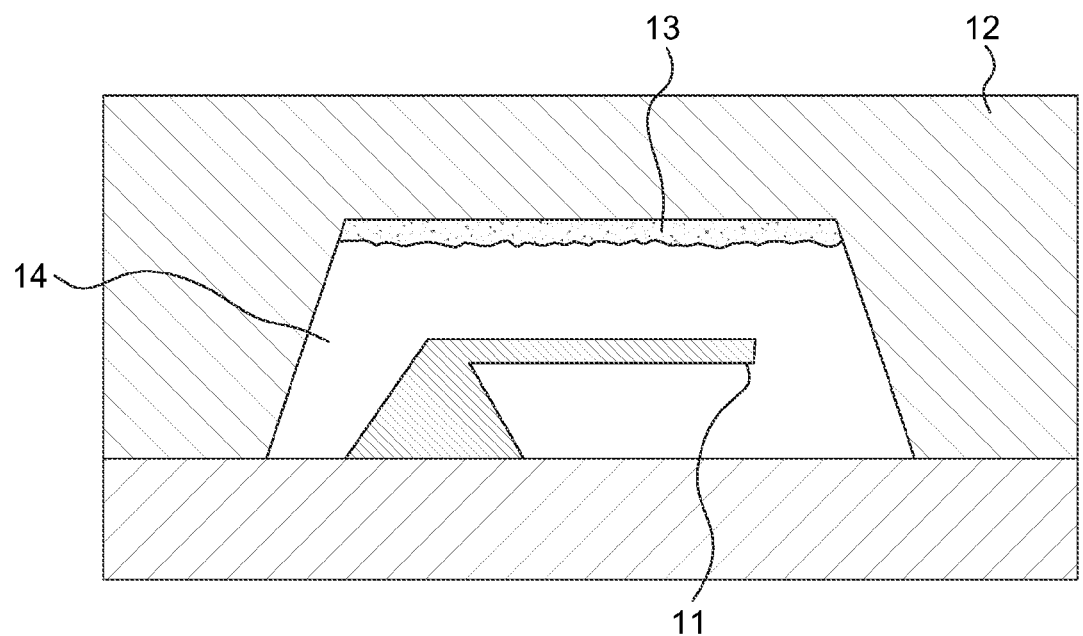
FIG. 1 (PRIOR ART) shows a cross-sectional side view of a MEMS device packaged in a microcavity in which a thin-film getter is deposited on an inner surface of the package cover.
Figure 2A:
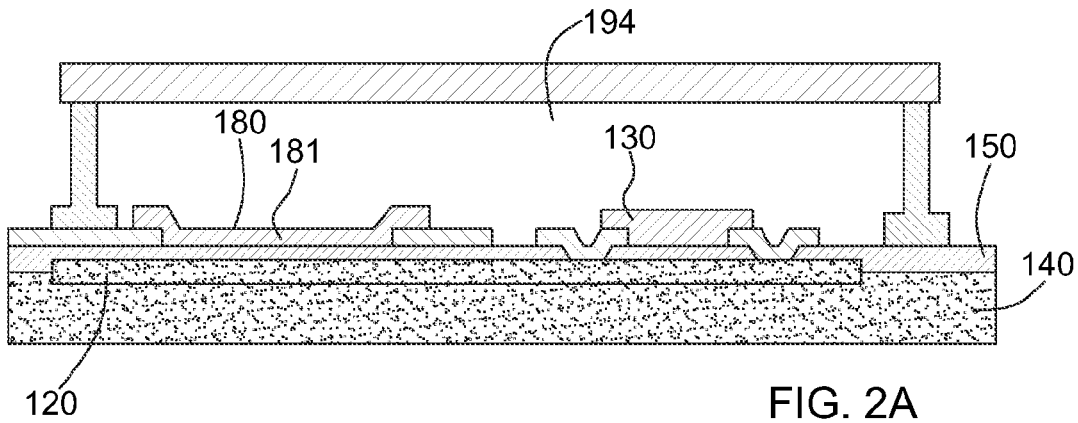
FIG. 2A (PRIOR ART) is a cross-sectional side view of a microcavity with a thin-film getter deposited in close proximity of other devices packaged in the microcavity, the getter being activated electrically.
Figure 2B:
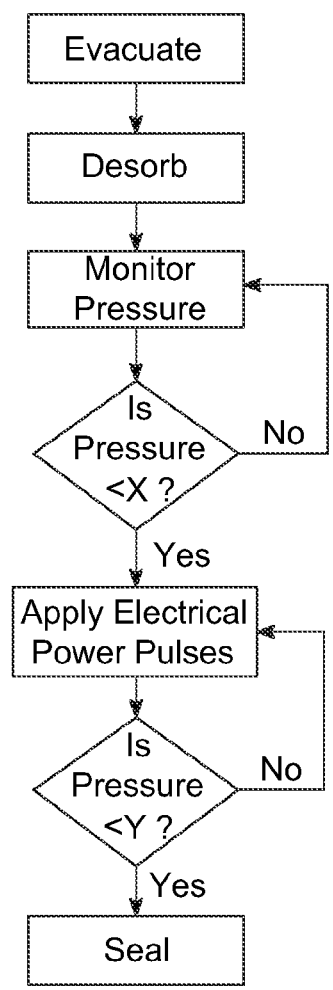
FIG. 2B (PRIOR ART) depicts the flow feedback control diagram of a method for activation of the thin-film getter integrated in the microcavity shown in FIG. 2A.
Figure 3:
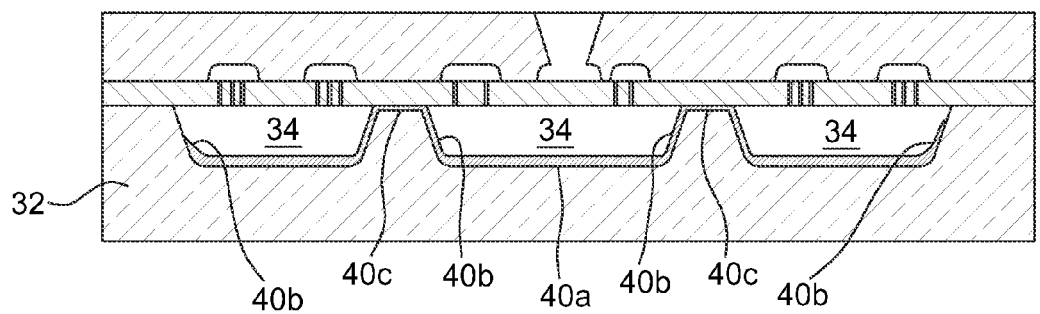
FIG. 3 (PRIOR ART) shows a cross-sectional side view of a series of packaged microdevices having getter thin films deposited on the bottom surfaces and on the sidewalls of the microcavities.
Figure 4:
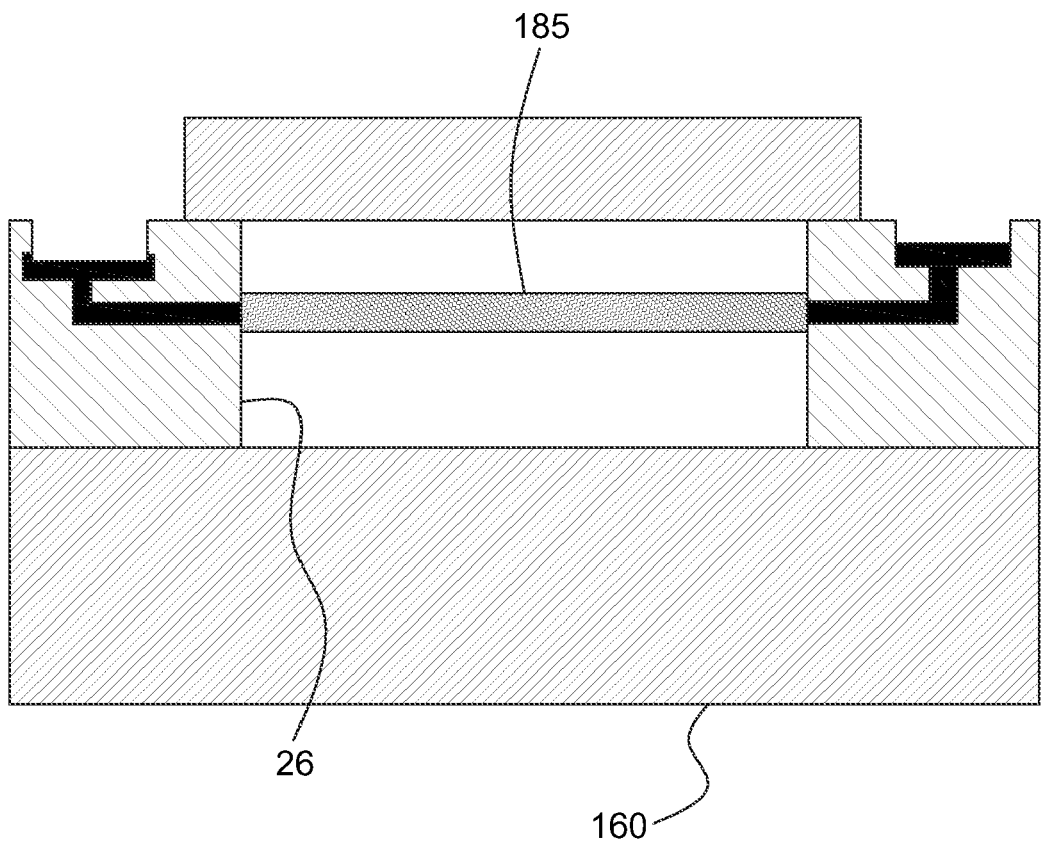
FIG. 4 (PRIOR ART) shows a cross-sectional side view of a microcavity including an electrically-activated getter film attached to the sidewalls of the microcavity.
Figure 5:
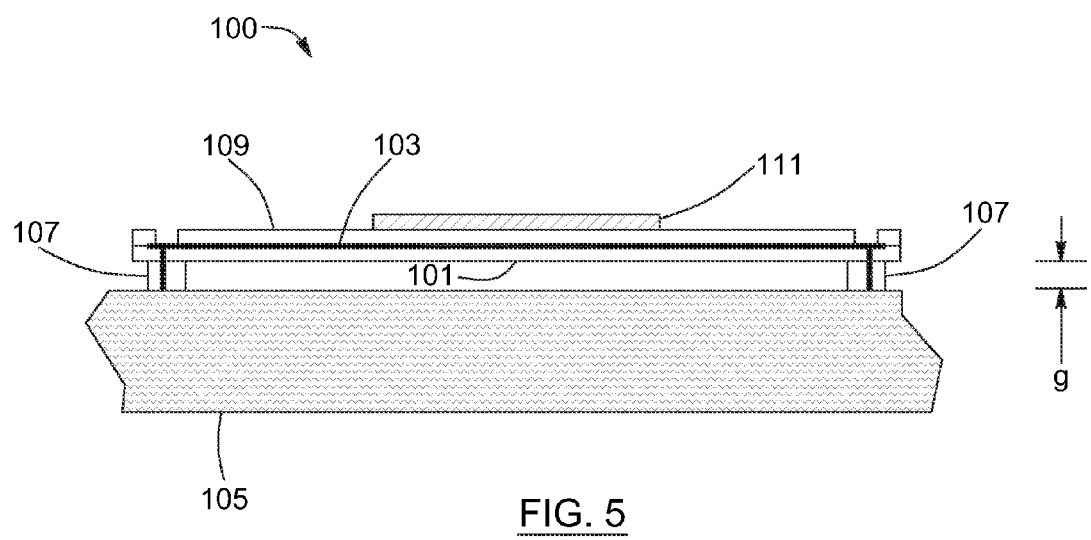
FIG. 5 illustrates a schematic cross-sectional side view of the MEMS-based getter microdevice with heater, heat spreader and getter thin film, according to a preferred embodiment of the present invention.

The accompanying drawings are not intended to be drawn to scale, and like reference numerals designate identical or corresponding parts throughout the views to be discussed in the following paragraphs. FIG. 5 illustrates a schematic cross-sectional side view of a preferred embodiment of a MEMS getter microdevice 100. The microdevice 100 includes a suspended structure (also referred to as a platform) 101 on which an electrically-resistive (resistor) element 103 has been patterned on its top surface. The suspended structure 101 is typically made up of a dielectric material such as but not limited to Si, $SiO_2$, $Si_3N_4$ or silicon oxinitride. The structure 101 is supported by supporting legs 107 in such a way that a vertical gap g is formed above the substrate 105 on which the microdevice 100 is fabricated. The supporting legs 107 also provide thermal insulation of the suspended structure 101 and of the various layers deposited thereon. This means that the design of the supporting legs 107 preferably aims at minimizing their thermal conductance. On one hand, thermally insulating the suspended structure 101 helps in reducing the electrical power required to set the MEMS getter microdevice 100 at its activation temperature. This is realized by using supporting legs 107 as long as possible while keeping their cross-sectional area small enough. On the other hand, the supporting legs 107 must have sufficient mechanical rigidity to adequately support the platform 101. This platform is preferably supported by two supporting legs 107, but this should not be construed as limiting the scope of the present invention since the number of supporting legs can be varied to better adapt to the specific configuration and/or dimensions of the platform 101. In some cases, the platform 101 can be held using a single supporting leg 107.

A heat-spreading layer 109, also typically made up of Si, $Si_3N_4$, $SiO_2$ or silicon oxinitride, is deposited on the suspended structure 101 so that the resistor element 103 is sandwiched between both elements 101 and 109. The role of the heat-spreading layer 109 is to favor a better uniformity of the temperature in the plane of the platform 101. The presence of the heat-spreading layer 109 enhances the mechanical rigidity of the whole getter microdevice 100 as well. Finally, the getter microdevice 100 comprises a non-evaporable thin-film getter material 111 deposited on a desired portion of the top surface of the heat-spreading layer 109. Another benefit of the heat-spreading layer 109 thereof is to avoid electrical shorts of the resistor element 103 that would result from its contact with the getter material 111, which is electrically conductive in most cases.

In FIG. 5, the vertical gap g that separates the underside of the platform 101 from the substrate 105 is preferably selected to be small enough to keep the fabrication of the whole microdevice 100 manageable. In turn, the gap must be large enough to prevent the suspended structure 101 from inadvertently contacting the substrate 105 to create detrimental thermal bridges. The vertical gap g is preferably set between 1 μm and 50 μm.

Various gettering materials 111 can be employed depending on the nature of the gases that will be released from the sidewalls and/or from the other structural parts of the package. For example, a getter that preferentially traps hydrogen would be selected when hydrogen is suspected to be outgassed therein. The getter material 111 consists typically of a metallic film made up of Ti (titanium), V (vanadium), Zr (zirconium) or of their alloys. The getter material can be a polymer as well. The getter material could be evaporated, sputtered or deposited in the form of a paste either by stencil printing, dispensing or stamping. Preferably, its thickness does not exceed 100 μm, while it is typically less than 20 to 30 μm. The thin-film getter 111 should be thick enough to have sufficient sorption capacity, as it will be apparent to a person skilled in the art. Once the material is selected, both extent and thickness of the getter thin film 111 are then determined according to the total amount of gas that is expected to be released in the microcavity. Note that the getter material 111 can also consist in a layer of porous single-crystal silicon. The layer is made porous either by etching or by depositing the silicon material with a porous nanostructure through the control of the deposition parameters.

The resistor element 103 deposited on the suspended structure 101 is made up preferably of $VO_x$ or of elemental vanadium to make its deposition fully compatible with previously-developed $VO_x$-based microbolometer process flows. It can be deposited by sputtering, thermal evaporation, ion beam or electroplating, and it is patterned to obtain the desired electrical resistance. The resistor material can be a metal such as but not limited to Al, Al-alloys, Ti, Ni—Cr (nichrome), Au, Ag or Cu. Alternatively, the resistor material can be an electrically-conductive nonmetal such as polysilicon or any other material having suitable electrical conductivity and that can be patterned using microfabrication techniques known in the art.

Figure 6:
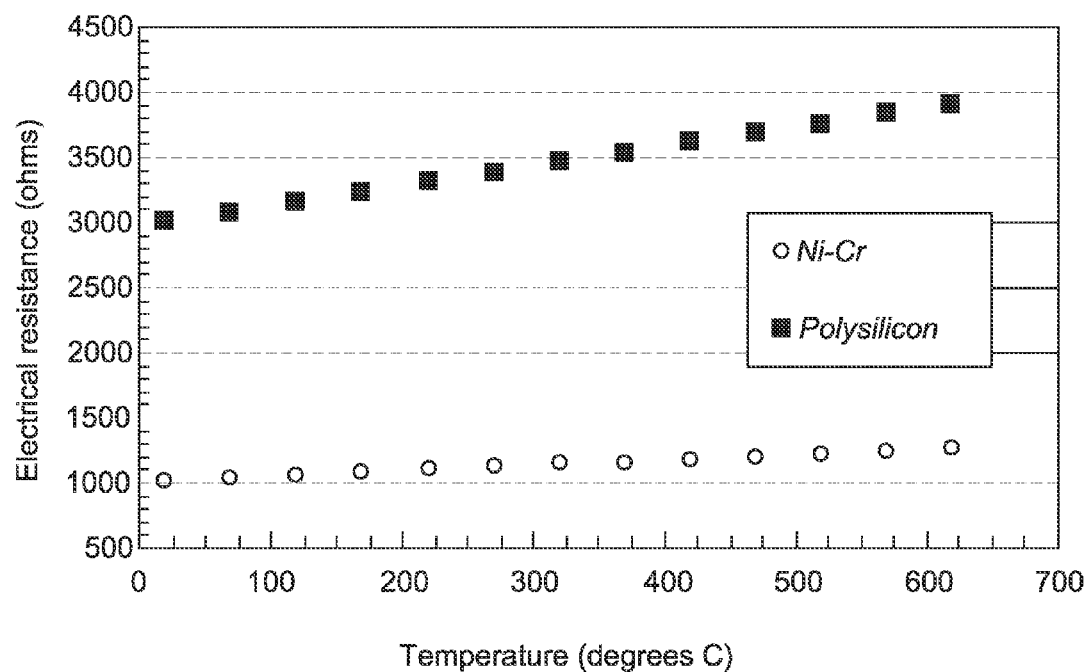
FIG. 6 is a graphical illustration of the variations of the electrical resistance of thin films made up of two different materials (Ni—Cr and polysilicon) as a function of their temperature.

The heat required to raise the getter material 111 to its activation temperature is provided by electrically powering the resistor element 103. A convenient feature of the resistor element 103 is its resistance that varies with the temperature, therefore enabling monitoring of the temperature of the thin-film getter 111 from a calibration curve previously established for the selected resistor material. Experimental data about the electrical resistance of thin films made up of Ni—Cr and of polysilicon measured over a convenient temperature range is illustrated graphically in FIG. 6. The data was retrieved from D. C. Giancoli (1995) *Physics*, (4$^{th}$ Ed., Prentice Hall) and from M. Prasad et al. (2009) "Design and development of polysilicon-based microhotplate for gas sensing application" (*Sensors and Transducers Journal* vol. 103, No. 4, pp. 44-51). The curves depicted in FIG. 6 indicate that Ni—Cr and polysilicon thin films exhibit temperature coefficients of resistance (also known as TCR) of $4\times10^{-4}$ C$^{-1}$ and $5\times10^{-4}$ C$^{-1}$, respectively, where C stands for degree Celsius. The temperature of the getter thin film 111 can then be known in real time by monitoring the resistance of the resistor element 103 during the activation process. The electrical current supplied to the resistor element 103 can then be tuned to provide the adequate electrical power to the MEMS getter microdevice 100. The resistor element 103 can be controlled manually or automatically via a control circuit realized with external electronics or with electronics integrated with the packaged microdevice. The resistor element 103 is generally driven with continuous current in order to increase the getter material temperature by Joule heating. In an alternative embodiment, the resistor element 103 is driven with electrical current pulses.

Figure 7:
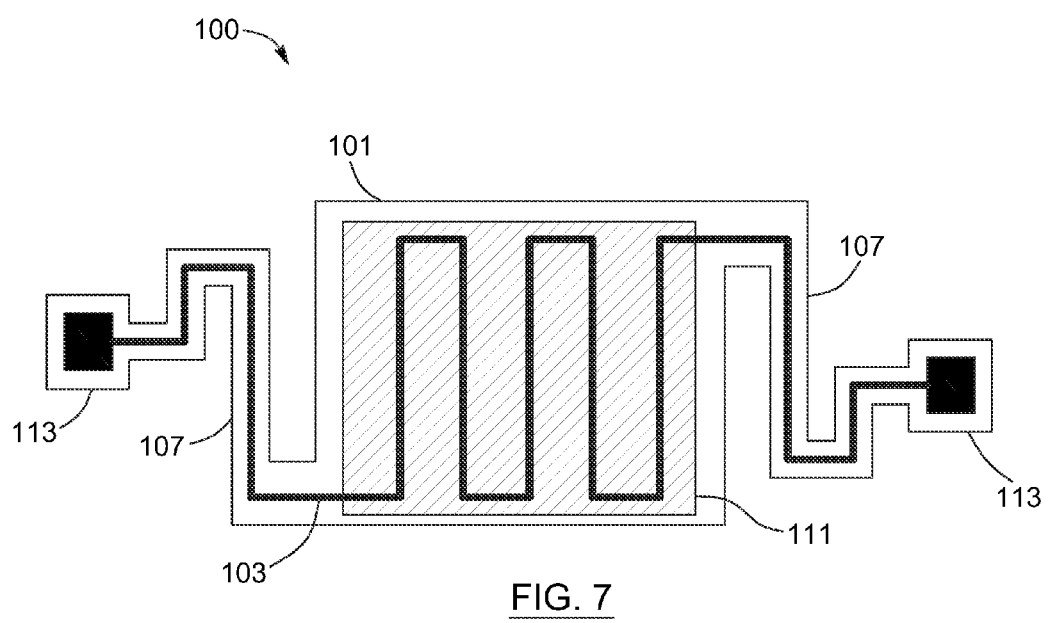
FIG. 7 shows a schematic top view of the MEMS-based getter microdevice illustrated in FIG. 5. Some elements of the microdevice are not illustrated in the figure.

FIG. 7 illustrates a schematic top view of the same MEMS getter microdevice 100 as shown in FIG. 5 and described in the preceding lines. All of the previously recited constituent elements of the microdevice 100 are shown in the figure, except for the heat-spreading layer 109 and the substrate 105, which have not been shown for better clarity. It can also be noted that the portion of the resistor element 103 located underneath the thin-film getter material 111 would normally be hidden by this material, which is sketched in the figure by the cross-hatched square area. The resistor element 103 is patterned according to a serpentine configuration, although various patterns for this element can be envisioned without departing from the scope of the present invention. A serpentine pattern for the resistor element 103 combines with the heat-spreading layer 109 to provide a better spatial uniformity for the heating of the getter material 111.

In the embodiment of FIG. 7, the resistor element 103 connects electrically to two contact pads 113, which are patterned on the substrate 105. The connection is realized through the segments of the resistor element 103 deposited on the top surface of both supporting legs 107. These legs can be shaped in various ways, with the objective of minimizing their overall thermal conductance while ensuring adequate support to the assembly formed of the suspended platform 101 and of the layers deposited thereon. For instance, each supporting leg 107 can be shaped according to a serpentine configuration to increase its effective length, provided that its width can be kept small enough. Alternatively, a portion of each supporting leg 107 can run beneath the suspended platform 101 to reduce the overall footprint of the MEMS getter microdevice 100. This approach reveals itself as being particularly attractive for getter microdevices 100 to be integrated in highly-packed packages. Although it cannot be easily guessed from both FIGS. 5 and 7, the straight segment of each supporting leg 107 has a slight tilt angle relative to the horizontal in order to connect the platform 101 to the substrate 105, recalling that both elements are spaced by the vertical gap g as previously shown in FIG. 5.

Figure 8:
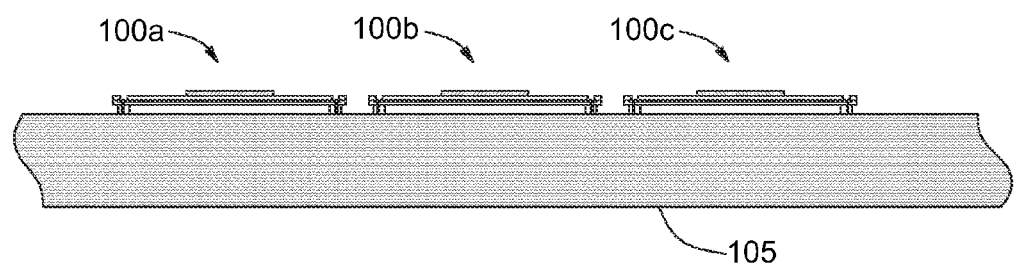
FIG. 8 shows an exemplary schematic cross-sectional side view of a linear array of three MEMS getter microdevices fabricated on a common substrate, each microdevice having a structure as depicted in FIG. 5.

In the design stage, the surface area required for a MEMS getter microdevice 100 can be determined according to the amount of gases that is expected to be released in the microcavity during the lifetime of the package. The surface area of a MEMS getter typically scales to less than 1×1 mm$^2$. The cross-sectional side view of FIG. 8 shows that larger gettering surface areas can be obtained by integrating on the same chip a plurality of individual units of the MEMS microdevice 100. Three MEMS getter microdevice units 100$a$, 100$b$, and 100$c$ have been integrated on a common substrate 105 in this exemplary embodiment. In practice, the MEMS getter units are accompanied by IC devices, microbolometer pixels or by other MEMS microdevices integrated on the same substrate. For the sake of clarity, none of these microdevices is shown in FIG. 8. The number of MEMS getter microdevices could be as high as allowed by the available footprint on the substrate 105. This number will be dictated by the surface area of each individual MEMS getter unit and by the effective gettering surface area required to ensure that the pressure in the microcavity will not exceed a maximum pressure during the lifetime of the package. The MEMS getter microdevice units can be disposed according to a linear arrangement, as shown in the exemplary embodiment of FIG. 8, or as a two-dimensional array. However, one skilled in the art will readily find that several arrangements can be imagined without departing from the scope of the present invention. In fact, the arrangement will often be determined by the locations of the other microdevices fabricated on the common substrate 105.

The MEMS microdevice units can be activated either sequentially or in parallel. In the sequential activation, the units are activated during the lifetime of the device, as required by the ambient pressure in the microcavity. Each MEMS getter microdevice unit can be reactivated several times, until its maximum capture capacity is attained. Alternatively, all of the MEMS getter microdevice units can be activated simultaneously to provide a faster "pumping speed" when desired. It can be noted that the simultaneous activation of the whole set of MEMS getter microdevices could lead to an unacceptable temperature rise of the assembly or to an excessive electrical power consumption. A hybrid activation scheme can also be contemplated, in which the whole set of MEMS getter microdevice units is activated in the early stage of the device lifetime, and then followed by a sequential activation regime to maintain the pressure inside of the microcavity below the maximum permissible pressure throughout the package's lifetime. The maximum permissible pressure may differ from MEMS device to MEMS device, ranging from less than 10 mTorr to a few hundreds Torrs. Optionally, the array of MEMS getter microdevice units can be integrated with pressure sensors in order to monitor the ambient pressure in the microcavity and then to determine when the units need to be reactivated.

Figure 9:
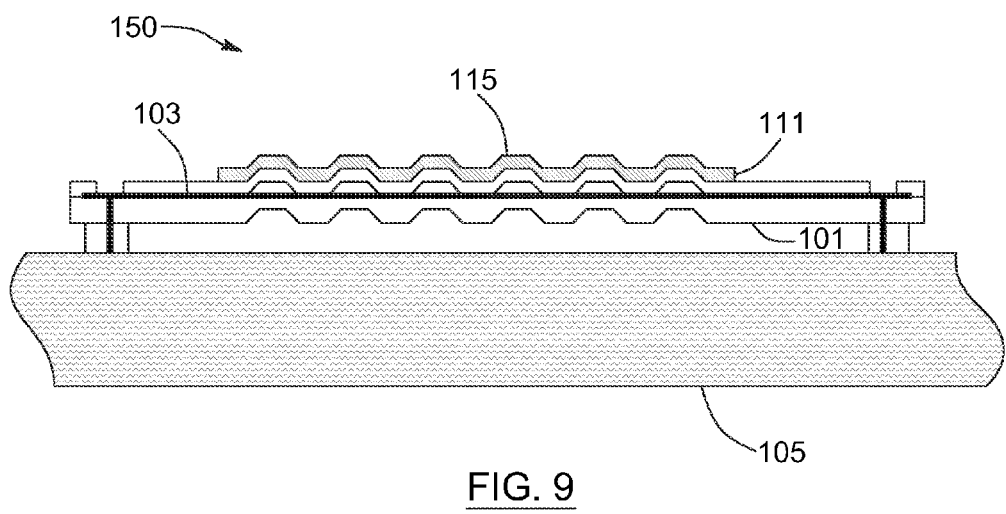
FIG. 9 shows a schematic cross-sectional side view of a MEMS getter microdevice having a thin-film getter material with greater surface area, according to another preferred embodiment of the present invention.
Figure 10:
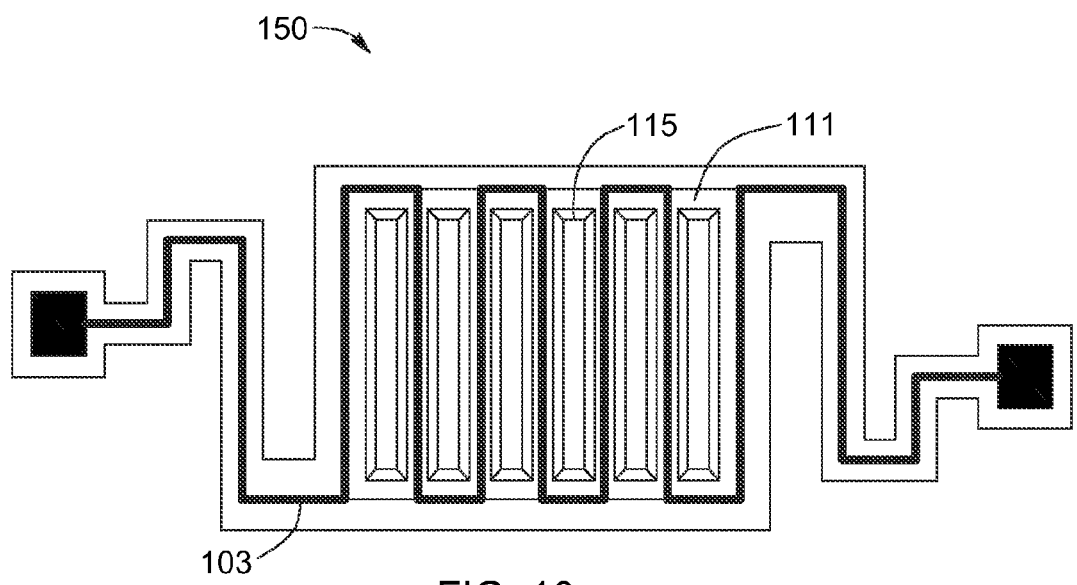
FIG. 10 is a schematic top view of the MEMS getter microdevice depicted in FIG. 9. Some elements of the microdevice are not illustrated in the figure.

Approaches for extending the lifetime of microdevices operating in vacuum consist in increasing either the capture surface area of the MEMS getter microdevices or the volume of the microcavity. The latter option is generally achieved through the use of packages fabricated with thicker ceramic spacers. Another preferred embodiment of the present invention relates to the former option since it discloses a MEMS getter microdevice 150 having an increased gettering surface area. A schematic cross-sectional side view and a top view of this embodiment are shown in FIGS. 9 and 10, respectively. Hence, a MEMS getter microdevice 150 having a corrugated surface area can be fabricated by implementing additional photolithography, etching, or embossing steps in the microfabrication process flow of the sacrificial layer that was present below the suspended structure 101. A clear advantage offered by this embodiment is that the capture surface area is increased while keeping the footprint of the MEMS getter microdevice 150 unchanged on the substrate 105. Referring more particularly to FIG. 9, it can be seen that the additional surface area varies according to the vertical excursion of the corrugations 115 of the getter thin film 111. In turn, the top view of FIG. 10 shows that the corrugations 115 can be precisely registered with respect to the serpentine pattern of the resistor element 103, so that the spatial uniformity of the getter temperature is maximized during its activation. In the exemplary embodiment of FIG. 10, the corrugations 115 run parallel to the longest segments of the resistor element 103. For the sake of clarity, the resistor element 103 has been sketched in solid thick line throughout its full length in FIG. 10. However, it must be recalled that the element 103 is located below the getter thin film 111, so that most of its length would be hidden when viewing the microdevice 150 from the top.

The MEMS getter microdevice of the present invention, in its various embodiments, can be fabricated simultaneously on the same substrate with the MEMS devices to be packaged in a common hermetic cavity. Alternatively, the MEMS getter microdevice can be fabricated on a separate chip and then co-integrated in a hermetic die-level package. It can be coupled with pressure sensors fabricated using the same process flow and with temperature sensors. The MEMS getter microdevice, pressure gauges and micro-thermometers can be fabricated simultaneously on the same die. Their microfabrication process is fully compatible with $VO_x$-based microbolometer process flows. In addition, if other MEMS devices are to be hermetically encapsulated, the fabrication of the MEMS getter microdevice of the present invention can be easily adapted to the microfabrication process flow pertaining to those MEMS devices.

Although only some exemplary embodiments of the present invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

The invention claimed is:

1. A MEMS getter microdevice enclosed in a hermetically sealed package, said package being disposed on a substrate, said MEMS getter microdevice being disposed on a portion of said substrate and comprising:
   a platform suspended at a predetermined height above a top surface of said substrate, said platform being supported by at least one supporting leg, said at least one supporting leg having dimensions selected to provide low thermal conductance between said platform and said substrate;
   a resistor element deposited on the top surfaces of said platform and of said at least one supporting legs, said resistor element being connected to electrical contact pads deposited on the top surface of said substrate, said resistor element providing heat when an electrical current is flowing through said resistor element;
   a heat-spreading layer deposited on the top surface of said platform and covering the top surface of said resistor element; and
   a getter deposited in the form of a thin film on a predetermined portion of the top surface of said heat-spreading layer, said thin-film getter having an activation temperature;
whereby said MEMS getter microdevice absorbs a portion of the gas species present in said package when said thin-film getter is heated at its activation temperature through electrical powering of said resistor element.

2. A MEMS getter microdevice according to claim 1, wherein said thin-film getter is made up of a material selected from the group consisting of titanium, vanadium, zirconium, and their alloys thereof.

3. A MEMS getter microdevice according to claim 1, wherein said thin-film getter is made up of a polymer.

4. A MEMS getter microdevice according to claim 1, wherein said thin-film getter is made up of porous single-crystal silicon.

5. A MEMS getter microdevice according to claim 1, wherein said thin-film getter is deposited by evaporation, sputtering or deposited in the form of a paste by stencil printing, dispensing or stamping.

6. A MEMS getter microdevice according to claim 1, wherein said resistor element has a serpentine pattern, said serpentine pattern covering a predetermined portion of said suspended platform.

7. A MEMS getter microdevice according to claim 1, wherein said thin-film getter has a thickness and a surface area adapted for absorption of the total amount of gas that is expected to be released in said package during its desired lifetime.

8. A MEMS getter microdevice according to claim 1, wherein said suspended platform has at least one corrugated region, said at least one corrugated region being reproduced on the top surface of said thin-film getter to provide greater surface area for absorption of gas species.

9. A MEMS getter microdevice according to claim 1, wherein said microdevice is fabricated using a vanadium-oxide-based microbolometer process flow.

* * * * *